(12) United States Patent
Che et al.

(10) Patent No.: US 10,121,848 B2
(45) Date of Patent: Nov. 6, 2018

(54) METHOD FOR MANUFACTURING MULTILAYER CROWN-SHAPED MIM CAPACITOR

(71) Applicant: Powerchip Technology Corporation, Hsinchu (TW)

(72) Inventors: Shyng-Yeuan Che, Hsinchu County (TW); Wen-Yi Wong, Kinmen County (TW)

(73) Assignee: Powerchip Technology Corporation, Hsinchu (TW)

( * ) Notice: Subject to any disclaimer, the term of this patent is extended or adjusted under 35 U.S.C. 154(b) by 54 days.

(21) Appl. No.: 15/594,653

(22) Filed: May 14, 2017

(65) Prior Publication Data

US 2017/0250245 A1 Aug. 31, 2017

Related U.S. Application Data

(62) Division of application No. 14/986,717, filed on Jan. 3, 2016, now Pat. No. 9,735,228.

(30) Foreign Application Priority Data

Sep. 8, 2015 (TW) .............................. 104129610 A

(51) Int. Cl.
*H01L 21/8242* (2006.01)
*H01L 49/02* (2006.01)
*H01L 21/768* (2006.01)
*H01L 29/66* (2006.01)

(52) U.S. Cl.
CPC .............. *H01L 28/75* (2013.01); *H01L 28/60* (2013.01); *H01L 21/76877* (2013.01); *H01L 29/66181* (2013.01)

(58) Field of Classification Search
USPC ........................................................ 438/387
See application file for complete search history.

(56) References Cited

U.S. PATENT DOCUMENTS 5,021,920 A    6/1991  Smith
7,763,520 B2 *  7/2010  Ahrens ................. H01L 29/945
                                            438/387

(Continued)

*Primary Examiner* — Chandra Chaudhari
(74) *Attorney, Agent, or Firm* — Winston Hsu

(57) ABSTRACT

A method for fabricating a multi-layer, crown-shaped MIM capacitor is provided. A base having therein a conductive region within a capacitor-forming region is formed. An IMD layer is deposited on the base to cover the capacitor-forming region. A capacitor trench is formed within the capacitor-forming region. The capacitor trench penetrates through the IMD layer, thereby exposing a portion of the conductive region. A concentric capacitor lower electrode structure is formed within the capacitor trench. The concentric capacitor lower electrode structure includes a first electrode and a second electrode surrounded by the first electrode. The first electrode is in direct contact with the conductive region. A conductive supporting pedestal is formed within the capacitor trench for fixing and electrically connecting bottom portions of the first and second electrodes. A capacitor dielectric layer conformally lining the first and second electrodes and a top surface of the conductive supporting pedestal is formed.

6 Claims, 8 Drawing Sheets

(56) References Cited

U.S. PATENT DOCUMENTS

| | | | |
|---|---|---|---|
| 7,880,268 B2* | 2/2011 | Cremer | .................. H01L 28/91 |
| | | | 257/532 |
| 2006/0086962 A1 | 4/2006 | Wu | |
| 2012/0080771 A1 | 4/2012 | Yang | |
| 2013/0181326 A1* | 7/2013 | Cheng | ............... H01L 21/32134 |
| | | | 257/E21.021 |

* cited by examiner

METHOD FOR MANUFACTURING MULTILAYER CROWN-SHAPED MIM CAPACITOR

CROSS REFERENCE TO RELATED APPLICATIONS

This application is a division of U.S. application Ser. No. 14/986,717 filed Jan. 3, 2016, which itself claims the benefit of Taiwan patent application No. 104129610, filed on Sep. 8, 2015. The above-mentioned applications are included in their entirety herein by reference.

BACKGROUND OF THE INVENTION

1. Field of the Invention

The present invention relates generally to a semiconductor device. More particularly, the present invention relates to a multi-layer, crown-shaped metal-insulator-metal (MIM) capacitor and a manufacturing method for making the same.

2. Description of the Prior Art

As known in the art, metal-insulator-metal (MIM) composite structures are often used as a capacitor in ultra-large scale integration (ULSI) designs.

With the increasing degree of integration of integrated circuit devices, the sizes of MIM capacitors also decrease. How to maintain and even increase the capacitance of the MIM capacitor has become a major challenge.

Conventionally, to increase the effective area of the capacitor plates, a crown-structured MIM capacitor is used. However, the prior art manufacturing process for forming the crown-structured MIM capacitor is complex, and multiple lithographic and etching steps are required. The reliability of the finished product is limited to the resolution of the lithography process.

Therefore, there remains a need in the art for a modified crown-type MIM capacitor structure and production method, which are not limited by the resolution of the lithographic process, and can have higher capacitance.

SUMMARY OF THE INVENTION

It is one objective of the invention to provide an improved multi-layer, crown-shaped metal-insulator-metal (MIM) capacitor and a manufacturing method for making the same. The disclosed multi-layer, crown-shaped MIM capacitor has higher capacitance and is suited for various integrated circuit devices.

According to one aspect of the invention, a multi-layer, crown-shaped metal-insulator-metal (MIM) capacitor is provided. The multi-layer, crown-shaped metal-insulator-metal (MIM) capacitor includes a base having therein a conductive region disposed within a capacitor-forming region; an inter-metal dielectric (IMD) layer on the base and covering the capacitor-forming region; a capacitor trench disposed within the capacitor-forming region and penetrating through the IMD layer, thereby exposing a portion of the conductive region; a concentric capacitor lower electrode structure within the capacitor trench, the concentric capacitor lower electrode structure including a first electrode and a second electrode surrounded by the first electrode, wherein the first electrode is in direct contact with the conductive region; a conductive supporting pedestal within the capacitor trench for fixing and electrically connecting bottom portions of the first and second electrodes; a capacitor dielectric layer conformally lining the first and second electrodes and a top surface of the conductive supporting pedestal; and a capacitor upper electrode on the capacitor dielectric layer.

According to another aspect of the invention, a method for fabricating a multi-layer, crown-shaped metal-insulator-metal (MIM) capacitor is provided. A base having therein a conductive region disposed within a capacitor-forming region is formed. An inter-metal dielectric (IMD) layer is deposited on the base and covering the capacitor-forming region. A capacitor trench is formed within the capacitor-forming region. The capacitor trench penetrates through the IMD layer, thereby exposing a portion of the conductive region. A concentric capacitor lower electrode structure is formed within the capacitor trench. The concentric capacitor lower electrode structure includes a first electrode and a second electrode surrounded by the first electrode. The first electrode is indirect contact with the conductive region. A conductive supporting pedestal is formed within the capacitor trench for fixing and electrically connecting bottom portions of the first and second electrodes. A capacitor dielectric layer conformally lining the first and second electrodes and a top surface of the conductive supporting pedestal is formed. A capacitor upper electrode is formed on the capacitor dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
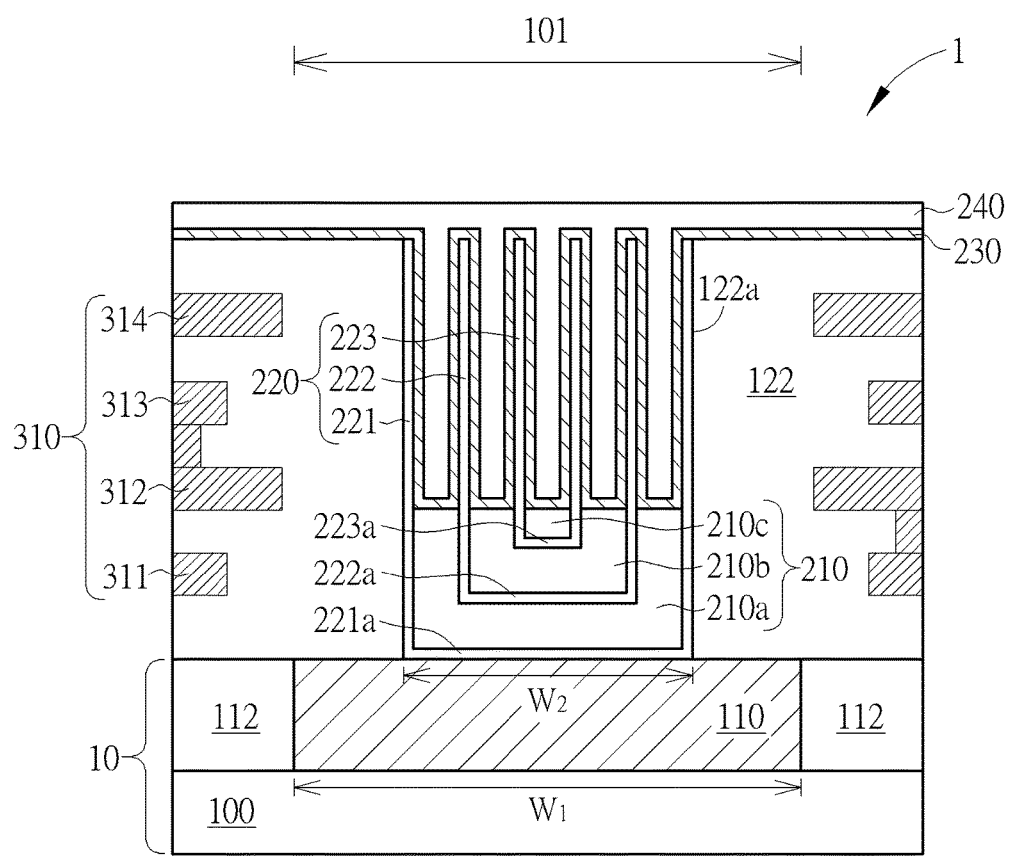
FIG. 1 is a schematic, cross-sectional diagram showing a multi-layer, crown-shaped metal-insulator-metal (MIM) capacitor according to one embodiment of the invention.

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Likewise, the drawings showing embodiments of the apparatus are semi-diagrammatic and not to scale and, particularly, some of the dimensions are for the clarity of presentation and are shown exaggerated in the FIGS. Also, where multiple embodiments are disclosed and described having some features in common, for clarity and ease of illustration and description thereof like or similar features one to another will ordinarily be described with like reference numerals.

The present invention pertains to a multi-layer, crown-shaped metal-insulator-metal (MIM) capacitor and a manufacturing method thereof. The disclosed manufacturing method is compatible with current logic processes and System-on-a-Chip (SoC) processes. The present invention multi-layer, crown-shaped MIM capacitor has high capacitance and is suited for various integrated circuit devices including, for example, but not limited to, electrostatic discharge (ESD) protection circuits for liquid crystal display (LCD) driving chips, or dynamic random access memory (DRAM), etc.

Figure 2:
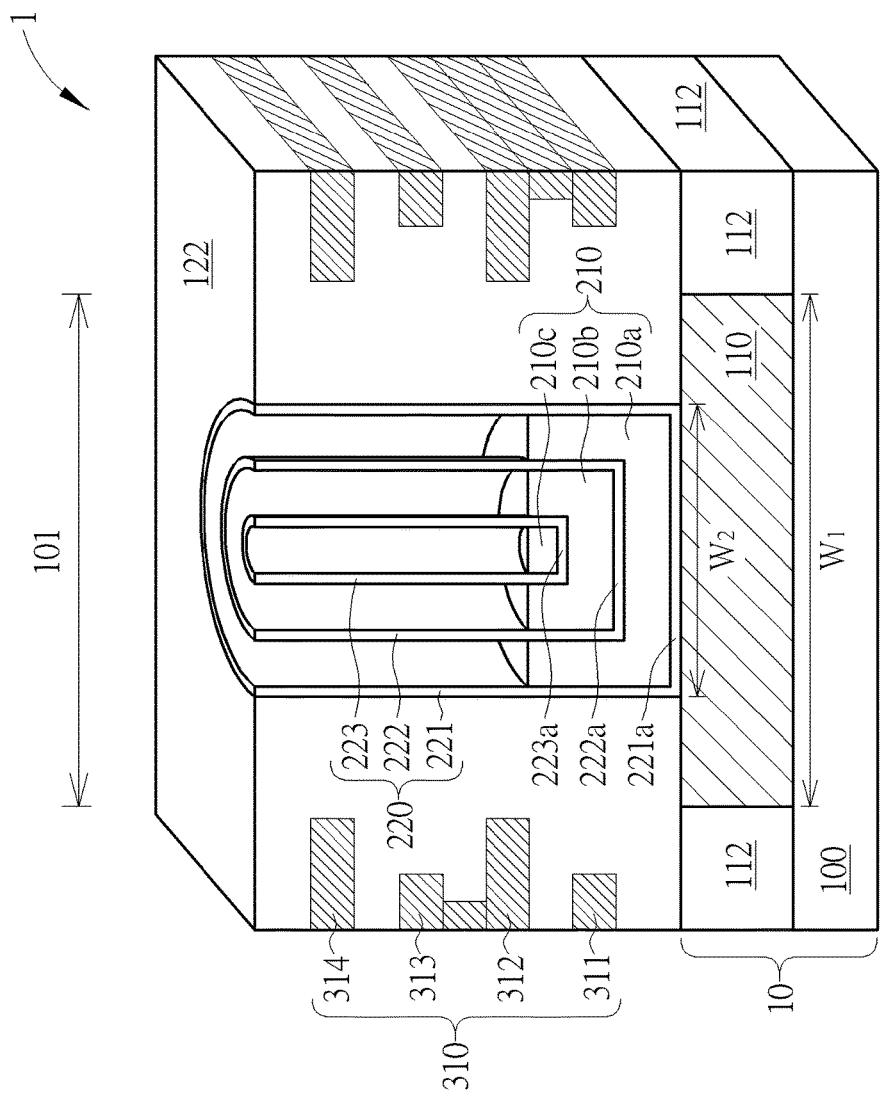
FIG. 2 is a perspective view of the concentric capacitor lower electrode of the multi-layer, crown-shaped MIM capacitor.

Please refer to FIG. 1 and FIG. 2. FIG. 1 is a schematic, cross-sectional diagram showing a multi-layer, crown-shaped metal-insulator-metal (MIM) capacitor according to one embodiment of the invention. FIG. 2 is a perspective view of the concentric capacitor lower electrode of the multi-layer, crown-shaped MIM capacitor.

As shown in FIG. 1, the multi-layer, crown-shaped MIM capacitor 1 is disposed on a base 10. The base 10 may include, but not limited to, a substrate 100 with at least a dielectric layer 112 deposited on the surface of the substrate 100. According to the embodiment of the invention, the substrate 100 may include any suitable semiconductor material, for example, silicon, germanium, gallium arsenide (GaAs), or indium phosphide (InP), but is not limited thereto. According to the embodiment of the invention, the base 10 may comprise a capacitor-forming region 101. The capacitor-forming region 101 may be located within a logic circuit region, but is not limited thereto. The multi-layer, crown-shaped MIM capacitor 1 is constructed within the capacitor-forming region 101.

According to the embodiment of the invention, a conductive region 110 may be disposed on the substrate 100. The conductive region 110 may be formed in the dielectric layer 112. The conductive region 110 may include, but not limited to, a polysilicon layer, a metal layer or the like. For example, the conductive region 110 may be a copper damascene metal layer or a tungsten metal plug, but is not limited thereto. In other embodiments, the conductive region 110 may be a conductive doping region disposed in the substrate 100, for example, an N type or a P type doping region. The conductive region 110 has a width w1.

According to the embodiment of the invention, at least one inter-metal dielectric (IMD) layer 122 is disposed on the base 10. For example, the IMD layer 122 may be a silicon oxide layer, a silicon nitride layer, a low-k dielectric layer, or an ultra-low-k dielectric layer, but is not limited thereto. It is to be understood that the IMD layer 122 may comprise multiple dielectric layers and may comprise different dielectric materials.

According to the embodiment of the invention, in the IMD layer 122 outside the capacitor-forming region 101, layers of metal interconnection structures 310, for example, metal layers 311, 312, 313, 314, are formed. It is to be understood that the metal layers 311, 312, 313, 314 are for illustration purposes only. The number of layers of the metal interconnection structures 310 is not limited thereto. For example, the number of layers of the metal interconnection structures 310 may depend upon the design requirements of the logic circuit chips, for example, usually between 3 and 9 layers, but is not limited thereto.

A capacitor trench 122a is formed in the capacitor-forming region 101. The capacitor trench 122a has a width w2. The width w2 of the capacitor trench 122a is preferably smaller than the width w1 of the conductive region 110. The capacitor trench 122a penetrates through the IMD layer 122. In other words, the depth of the capacitor trench 122a is equal to the entire thickness of the IMD layer 122.

Please also refer to FIG. 2, according to the embodiment of the invention, a concentric capacitor lower electrode structure 220 is arranged within the capacitor trench 122a. The capacitor lower electrode structure 220 comprises a first (outer) lower electrode 221, a second (middle) lower electrode 222, and a third (inner) lower electrode 223. It is to be understood that the lower electrodes 221, 222, 223 are for illustration purposes only. The layers of the capacitor lower electrode structure 220 are not limited to the shown layers in this figure.

According to the embodiment of the invention, the first lower electrode 221 is a tube-shaped container electrode that conformally lining the interior surface of the capacitor trench 122a. The first lower electrode 221 has a bottom portion 221a that is in direct contact with the conductive region 110. The second lower electrode 222 is disposed inside the first lower electrode 221 and has a similar tube-shape. The second lower electrode 222 has a bottom portion 222a that is disposed at a higher level than that of the bottom portion 221a of the first lower electrode 221. The bottom portion 222a is not in direct contact with the bottom portion 221a of the first lower electrode 221. The third lower electrode 223 is disposed inside the second lower electrode 222 and has a similar tube-shape. The third lower electrode 223 has a bottom portion 223a that is disposed at a higher level than that of the bottom portion 222a of the second lower electrode 222. The bottom portion 223a is not indirect contact with the bottom portion 222a of the second lower electrode 222.

According to the embodiment of the invention, the topmost ends of the first lower electrode 221, the second lower electrode 222, and the third lower electrode 223 are substantially flush with the top surface of the IMD layer 122. In other words, the first lower electrode 221, the second lower electrode 222, and the third lower electrode 223 are only formed within the capacitor trench 122a and are not formed outside the capacitor trench 122a.

According to the embodiment of the invention, a conductive supporting pedestal 210 is formed at the bottom of the capacitor trench 122a. The conductive supporting pedestal 210 fixes and electrically connects the bottom portion 221a of the first lower electrode 221, the bottom portion 222a of the second lower electrode 222, and the bottom portion 223a of the third lower electrode 223. The conductive supporting pedestal 210 supports the first lower electrode 221, the second lower electrode 222, and the third lower electrode 223 and avoids collapse of the first lower electrode 221, the second lower electrode 222, and the third lower electrode 223. According to the embodiment of the invention, the top surface of the conductive supporting pedestal 210 is slightly higher than the bottom portion 223a of the third lower electrode 223.

According to the embodiment of the invention, the conductive supporting pedestal 210 may be composed of tungsten, but is not limited thereto. According to the embodiment of the invention, the first lower electrode 221, the second lower electrode 222, and the third lower electrode 223 may be composed of titanium or titanium nitride, but is not limited thereto. According to the embodiment of the invention, the conductive supporting pedestal 210 has a high etching selectivity to the capacitor lower electrode structure 220 with respect to a specific etchant such as diluted sulfuric acid/hydrogen peroxide solution (DSP).

As shown in FIG. 1, on the upper surface of the electrode structure of the capacitor 220, a conformal capacitor dielectric layer 230 may be provided, e.g., $HfO_2$ or $ZrO_2$ high-dielectric constant material, but is not limited thereto. The thickness of the capacitor dielectric layer 230 is insufficient to completely fill the gaps between the lower electrodes 221, 222, 223. According to the embodiment of the present invention, the capacitor dielectric layer 230 may cover the top surface of the IMD layer 122.

According to the embodiment of the invention, a capacitor upper electrode 240 is formed on the capacitor dielectric layer 230. The capacitor upper electrode 240 may fill up the gaps between the first lower electrode 221, the second lower electrode 222, and the third lower electrode 223. According to the embodiment of the invention, the capacitor upper electrode 240 may comprise copper, aluminum, titanium, titanium nitride, tungsten or the like, but is not limited thereto. The capacitor upper electrode 240 may be formed by using an atomic layer deposition (ALD) method, sputtering, physical vapor deposition (PVD) method or the like, but is not limited thereto.

Figure 3:
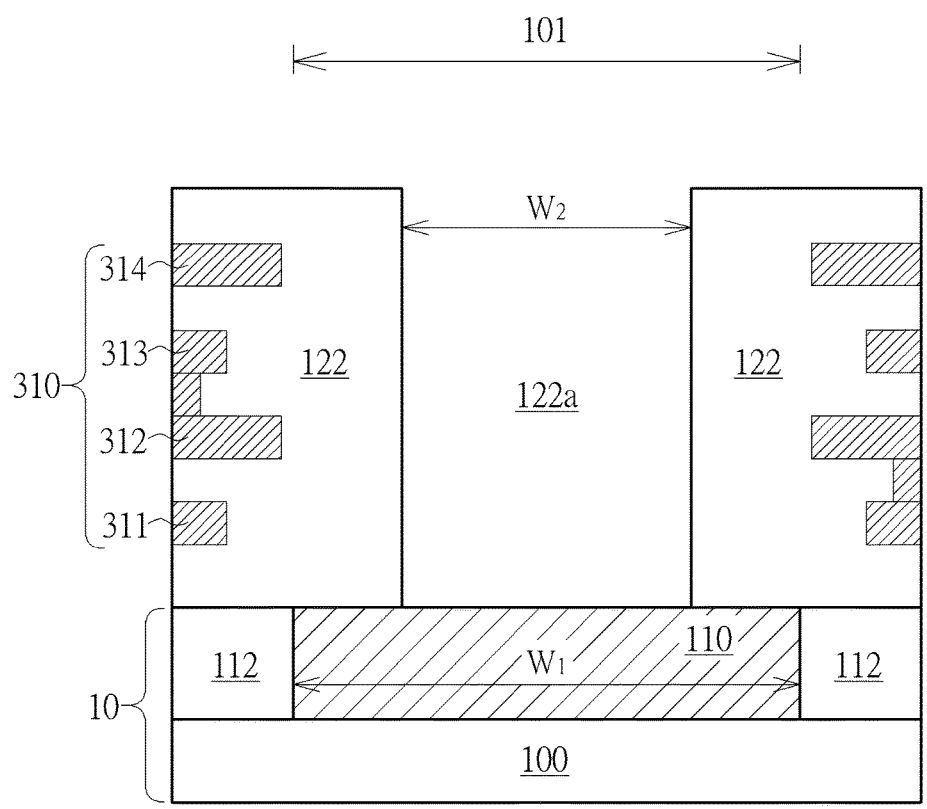
FIG. 3 to FIG. 8 illustrate an exemplary method for forming the multi-layer, crown-shaped MIM capacitor of FIG. 1.

Please refer to FIG. 3 to FIG. 8, which illustrate an exemplary method for forming the multi-layer, crown-shaped MIM capacitor of FIG. 1. First, as shown in FIG. 3, a base 10 is provided. The base 10 may include, but not limited to, a substrate with at least a dielectric layer 102 deposited on its surface. According to the embodiment of the invention, the substrate 100 may be any semiconductor material, e.g., silicon, germanium, gallium arsenide, indium phosphide, etc., but is not limited thereto. According to the embodiment of the invention, the base 10 comprises at least one capacitor-forming region 101. The capacitor-forming region 101 may be located within a logic circuit area, but is not limited thereto.

According to the embodiment of the invention, a conductive region 110 may be disposed on the substrate 100. The conductive region 110 may be formed in the dielectric layer 112. The conductive region 110 may include, but not limited to, a polysilicon layer, a metal layer or the like. For example, the conductive region 110 may be a copper damascene metal layer or a tungsten metal plug, but is not limited thereto. In other embodiments, the conductive region 110 may be a conductive doping region disposed in the substrate 100, for example, an N type or a P type doping region. The conductive region 110 has a width w1.

According to the embodiment of the invention, at least one inter-metal dielectric (IMD) layer 122 is disposed on the base 10. For example, the IMD layer 122 may be a silicon oxide layer, a silicon nitride layer, a low-k dielectric layer, or an ultra-low-k dielectric layer, but is not limited thereto. It is to be understood that the IMD layer 122 may comprise multiple dielectric layers and may comprise different dielectric materials.

According to the embodiment of the invention, in the IMD layer 122 outside the capacitor-forming region 101, layers of metal interconnection structures 310, for example, metal layers 311, 312, 313, 314, are formed. It is to be understood that the metal layers 311, 312, 313, 314 are for illustration purposes only. The number of layers of the metal interconnection structures 310 is not limited thereto. For example, the number of layers of the metal interconnection structures 310 may depend upon the design requirements of the logic circuit chips, for example, usually between 3 and 9 layers, but is not limited thereto.

Subsequently, a lithographic process and an etching process are performed to form a capacitor trench 122a in the capacitor-forming region 101. A portion of the top surface of the conductive region 110 is exposed. The capacitor trench 122a has a width w2. The width w2 of the capacitor trench 122a is preferably smaller than the width w1 of the conductive region 110. The capacitor trench 122a penetrates through the IMD layer 122. In other words, the depth of the capacitor trench 122a is equal to the entire thickness of the IMD layer 122.

Figure 4:
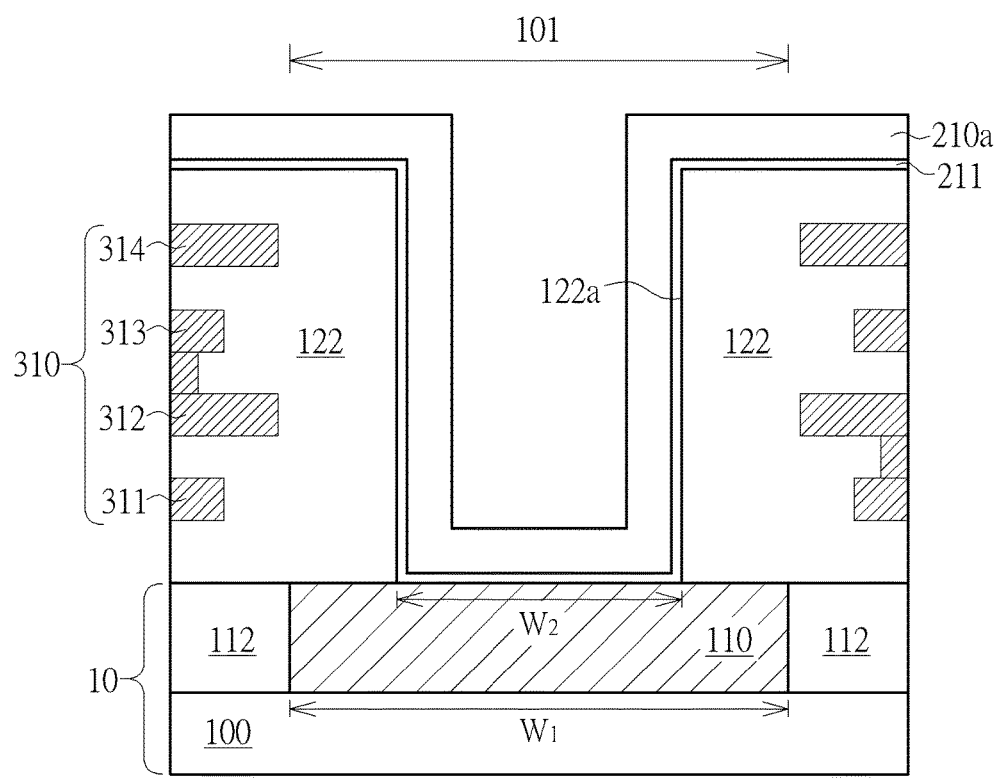

As shown in FIG. 4, a deposition process such as CVD or PVD process may be carried out to conformally deposit a first metal layer 211 and a first conductive support layer 210a on the interior surface of the capacitor trench 122a and the top surface of the IMD layer 122. According to the embodiment of the invention, for example, the first metal layer 211 may be composed of titanium or titanium nitride, but is not limited thereto. The first conductive support layer 210a may be composed of tungsten or doped polysilicon, but is not limited thereto.

Figure 5:
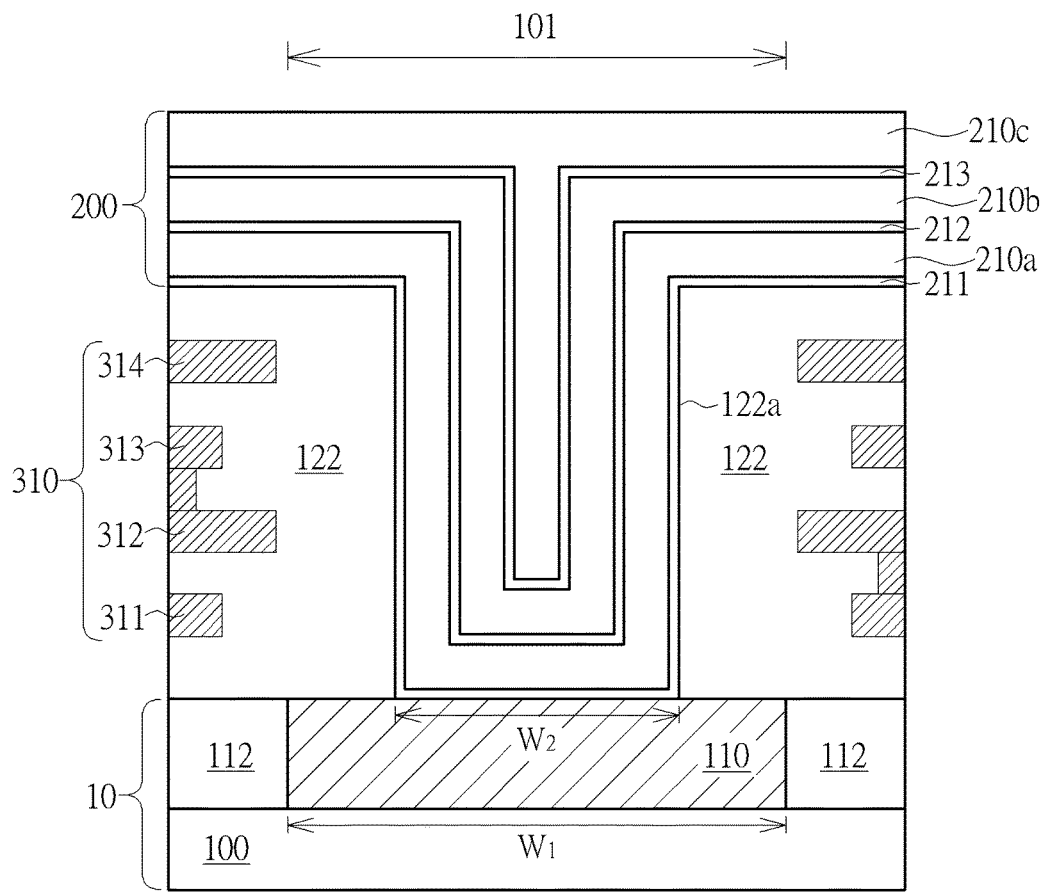

As shown in FIG. 5, a plurality of deposition processes are carried out, for example, CVD or PVD processes, to form a second metal layer 212, a second conductive support layer 210b, a third metal layer 213, a third conductive support layer 210c on the first conductive layer 210a in the capacitor trench 122a. For example, the first metal layer 211, the second metal layer 212, and the third metal layer 213 may have a thickness ranging between 250 angstroms and 500 angstroms. The first conductive support layer 210a, the second conductive support layer 210b, and the third conductive support layer 210c may have a thickness ranging between 2000 angstroms and 3000 angstroms. The first metal layer 211, the second metal layer 212, the third metal layer 213, the first conductive support layer 210a, the second conductive support layer 210b, and the third conductive support layer 210c constitute a multi-layer stack structure 200.

Figure 6:
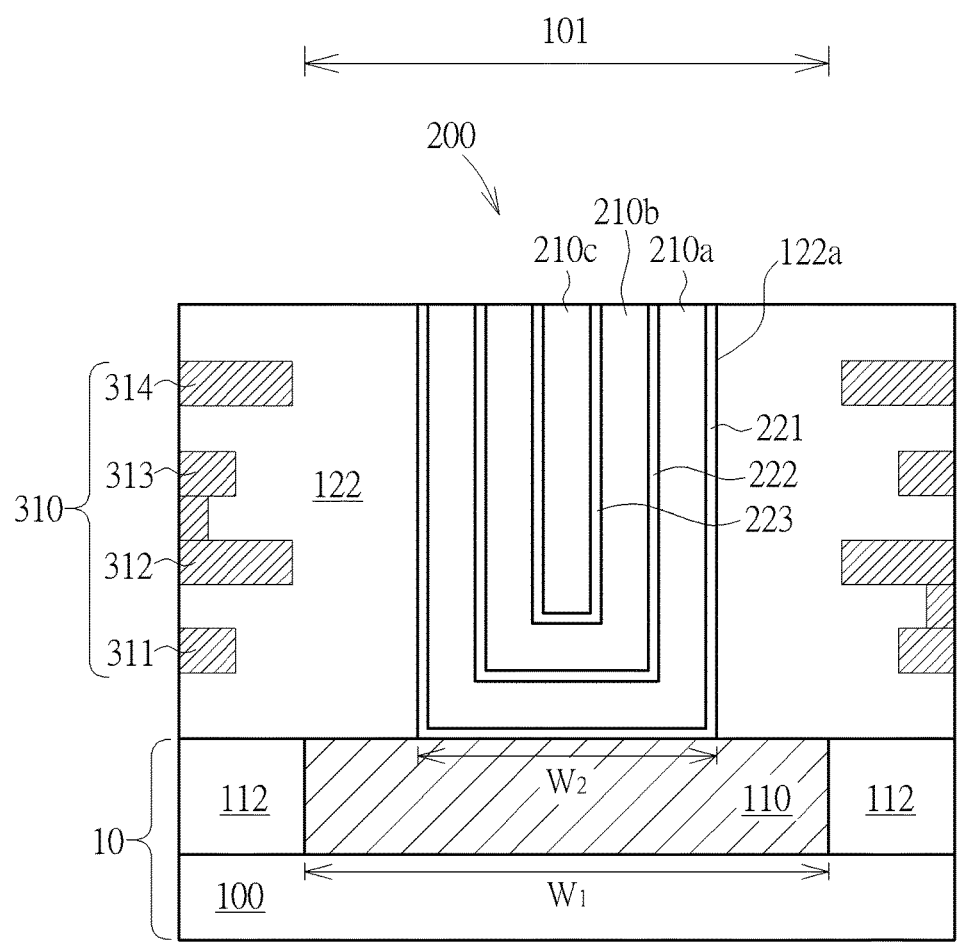

As shown in FIG. 6, a chemical mechanical polishing (CMP) process is performed to remove the multi-layer stack structure 200 outside the capacitor trench 122a. At his point, the top surface of the IMD layer 122 is exposed and the remaining multi-layer stack structure 200 is only in the capacitor trench 122a. A concentric, tube-shaped structure comprised of the first lower electrode 221, the second lower electrode 222, and the third lower electrode 223 is formed. At his point, the top surface of the IMD layer 122 is flush with the top surface of the multi-layer stack structure 200.

Figure 7:
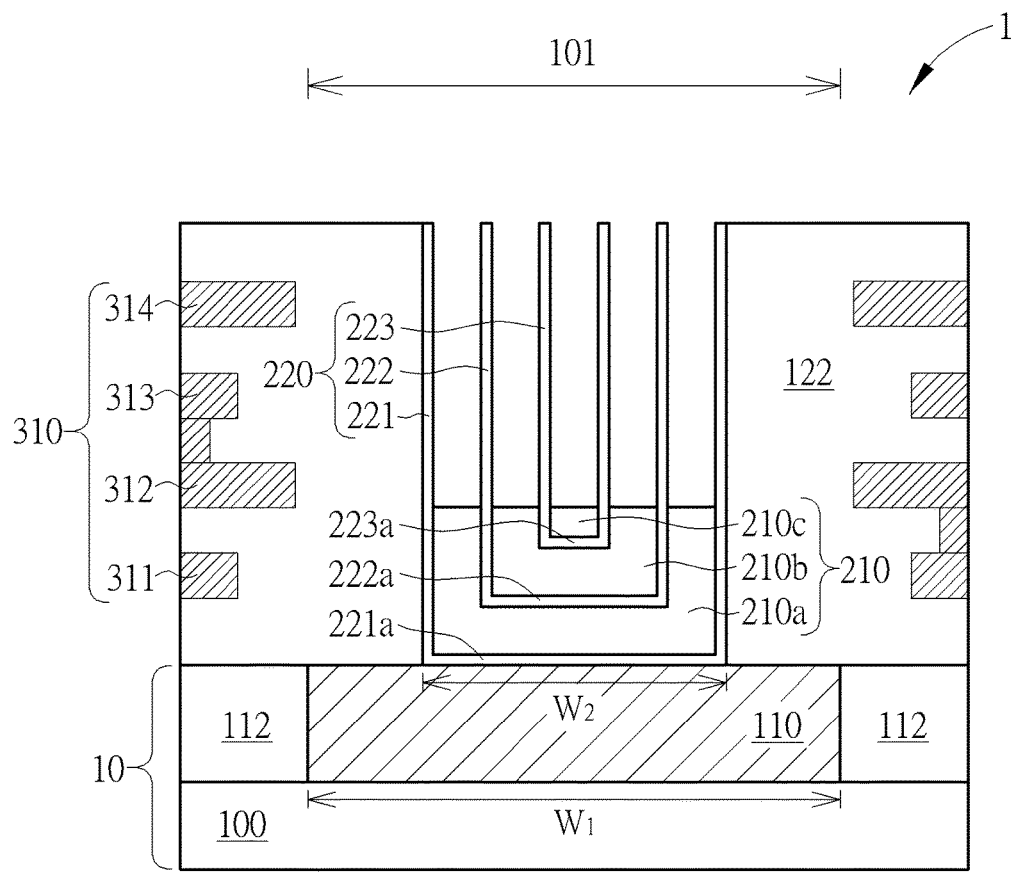

As shown in FIG. 7, an etching process is performed, for example, diluted sulfuric acid/hydrogen peroxide solution (DSP) etching, to selectively etch a portion of the first conductive support layer 210a, the second conductive support layer 210b, and the third conductive support layer 210c, to expose the upper portions of the first lower electrode 221, the second lower electrode 222, and the third lower electrode 223. The remaining first conductive support layer 210a, the second conductive support layer 210b, and the third conductive support layer 210c constitute a conductive supporting pedestal 210. The conductive supporting pedestal 210 has a top surface that is slightly higher than the bottom portion 223a of the third lower electrode 223. The first lower electrode 221, the second lower electrode 222, the third lower electrode 223, and the conductive supporting pedestal 210 constitute a capacitor lower electrode structure 220.

Figure 8:
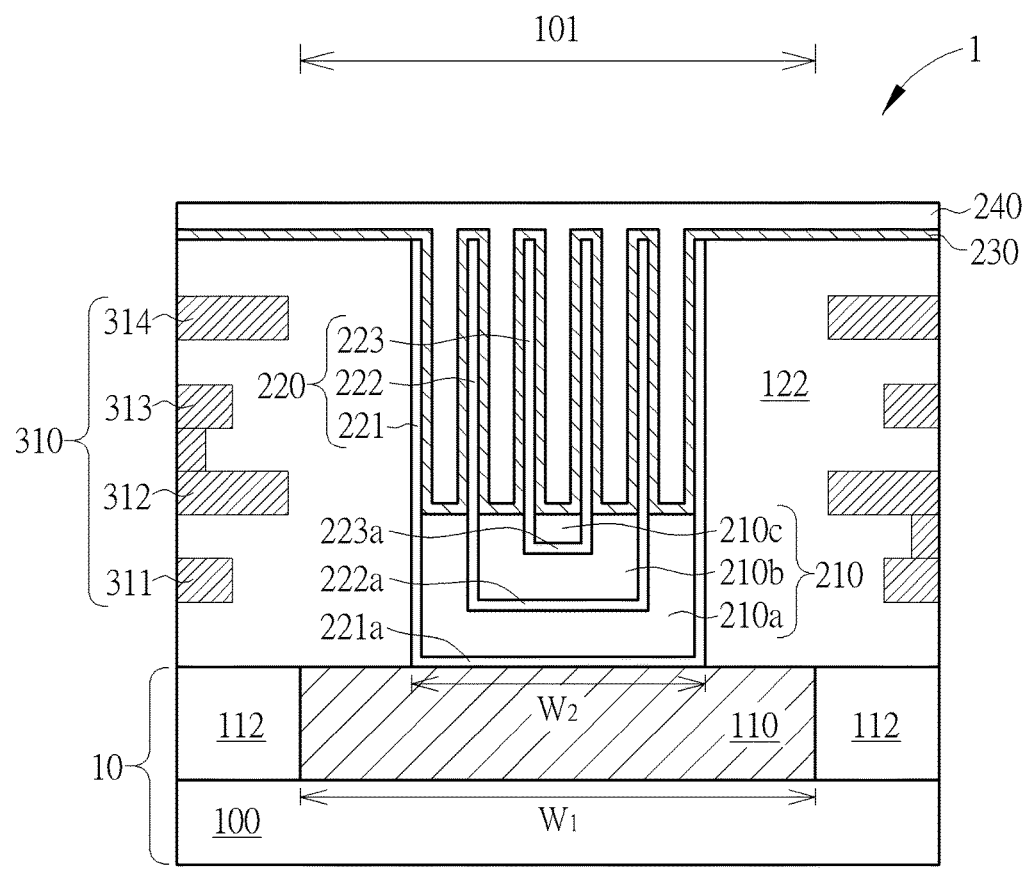

As shown in FIG. 8, on the upper surface of the electrode structure of the capacitor 220, a conformal capacitor dielectric layer 230 may be provided, e.g., $HfO_2$ or $ZrO_2$ high-dielectric constant material, but is not limited thereto. The thickness of the capacitor dielectric layer 230 is insufficient to fill up the gaps between the lower electrodes 221, 222, 223. According to the embodiment of the present invention, the capacitor dielectric layer 230 may cover the top surface of the IMD layer 122.

A capacitor upper electrode 240 is then formed on the capacitor dielectric layer 230. The capacitor upper electrode 240 may fill up the gaps between the first lower electrode 221, the second lower electrode 222, and the third lower electrode 223. According to the embodiment of the invention, the capacitor upper electrode 240 may comprise copper, aluminum, titanium, titanium nitride, tungsten or the like, but is not limited thereto. The capacitor upper electrode 240 may be formed by using an atomic layer deposition (ALD) method, sputtering, physical vapor deposition (PVD) method or the like, but is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a multi-layer, crown-shaped metal-insulator-metal (MIM) capacitor, comprising:

providing a base having therein a conductive region disposed within a capacitor-forming region;

depositing an inter-metal dielectric (IMD) layer on the base and covering the capacitor-forming region;

forming a capacitor trench within the capacitor-forming region, the capacitor trench penetrating through the IMD layer, thereby exposing a portion of the conductive region;

forming a concentric capacitor lower electrode structure within the capacitor trench, the concentric capacitor lower electrode structure including a first electrode and a second electrode surrounded by the first electrode, wherein the first electrode is in direct contact with the conductive region;

forming a conductive supporting pedestal within the capacitor trench for fixing and electrically connecting bottom portions of the first and second electrodes, wherein the conductive supporting pedestal comprising an inner portion situated at the bottom portion of the second electrode and an annular outer portion situated between the first electrode and the second electrode, and wherein the inner portion is not in direct contact with the annular outer portion;

forming a capacitor dielectric layer conformally lining the first and second electrodes and a top surface of the conductive supporting pedestal; and forming a capacitor upper electrode on the capacitor dielectric layer.

2. The method for fabricating a multi-layer, crown-shaped MIM capacitor according to claim 1, wherein before forming the capacitor trench in the IMD layer, a metal interconnection structure is formed within the IMD layer outside the capacitor-forming region.

3. The method for fabricating a multi-layer, crown-shaped MIM capacitor according to claim 1, wherein the capacitor upper electrode fills up a gap between the first lower electrode and the second lower electrode.

4. The method for fabricating a multi-layer, crown-shaped MIM capacitor according to claim 3, wherein the capacitor upper electrode comprises copper, aluminum, titanium, titanium nitride, or tungsten.

5. The method for fabricating a multi-layer, crown-shaped MIM capacitor according to claim 1, wherein the first lower electrode and the second lower electrode comprise titanium or titanium nitride.

6. The method for fabricating a multi-layer, crown-shaped MIM capacitor according to claim 5, wherein the conductive supporting pedestal comprises tungsten.

* * * * *